(12) United States Patent
Chung

(10) Patent No.: US 8,607,019 B2
(45) Date of Patent: Dec. 10, 2013

(54) CIRCUIT AND METHOD OF A MEMORY COMPILER BASED ON SUBTRACTIVE APPROACH

(76) Inventor: Shine C. Chung, San Jose, CA (US)

( * ) Notice: Subject to any disclaimer, the term of this patent is extended or adjusted under 35 U.S.C. 154(b) by 0 days.

(21) Appl. No.: 13/397,673

(22) Filed: Feb. 15, 2012

(65) Prior Publication Data

US 2012/0209888 A1    Aug. 16, 2012

Related U.S. Application Data

(60) Provisional application No. 61/443,172, filed on Feb. 15, 2011.

(51) Int. Cl.
*G06F 13/28* (2006.01)

(52) U.S. Cl.
USPC ............. 711/171; 711/2; 711/170; 707/802

(58) Field of Classification Search
None
See application file for complete search history.

(56) References Cited

U.S. PATENT DOCUMENTS

| | | | |
|---|---|---|---|
| 3,198,670 A | 8/1965 | Nissim | |
| 6,243,864 B1 * | 6/2001 | Odani et al. | 717/154 |
| 6,400,540 B1 | 6/2002 | Chang | |
| 6,405,160 B1 * | 6/2002 | Djaja et al. | 703/24 |
| 6,483,734 B1 | 11/2002 | Sharma et al. | |
| 6,813,705 B2 * | 11/2004 | Duesterwald et al. | 712/216 |
| 6,970,988 B1 | 11/2005 | Chung | |
| 7,212,432 B2 | 5/2007 | Ferrant et | |
| 7,391,064 B1 | 6/2008 | Tripsas et al. | |
| 7,461,371 B2 * | 12/2008 | Luo et al. | 717/167 |
| 7,696,017 B1 | 4/2010 | Tripsas et al. | |
| 7,764,532 B2 | 7/2010 | Kurjanowicz et al. | |
| 7,802,057 B2 * | 9/2010 | Iyer et al. | 711/136 |
| 7,833,823 B2 | 11/2010 | Klersy | |
| 7,889,204 B2 * | 2/2011 | Hansen et al. | 345/522 |
| 8,089,137 B2 | 1/2012 | Lung et al. | |
| 8,168,538 B2 | 5/2012 | Chen et al. | |
| 8,179,711 B2 | 5/2012 | Kim et al. | |
| 8,183,665 B2 | 5/2012 | Bertin et al. | |
| 8,217,490 B2 | 7/2012 | Bertin et al. | |
| 2003/0135709 A1 * | 7/2003 | Niles et al. | 711/220 |
| 2004/0057271 A1 | 3/2004 | Parkinson | |
| 2004/0113183 A1 | 6/2004 | Karpov et al. | |
| 2005/0060500 A1 * | 3/2005 | Luo et al. | 711/147 |
| 2005/0146962 A1 | 7/2005 | Schreck | |
| 2006/0129782 A1 * | 6/2006 | Bansal et al. | 711/170 |

(Continued)

OTHER PUBLICATIONS

U.S. Appl. No. 13/471,704, filed Feb. 1, 2011.

(Continued)

*Primary Examiner* — Hung Le

(57) ABSTRACT

A memory compiler to generate a set of memories is based on a subtraction approach from a set of templates (memory templates), including at least one layout database and auxiliary design databases, by software. The software can be based on general-purpose programming language or a layout-specific language. The compiled memories can be generated by reducing the memory array sizes in row and/or column directions by moving, deleting, adding, sizing, or stretching the layout objects, and disabling the high order addresses, etc. from the memory template by software. The new auxiliary design databases, such as layout phantom, behavior model, synthesis view, placement-and-routing view or datasheet, can also be generated by modifying some parameters from the memory template by software. One-time programmable memory using junction diode, polysilicon diode, or isolated active-region diode as program selector in a cell can be generated accordingly.

20 Claims, 11 Drawing Sheets

(56) References Cited

U.S. PATENT DOCUMENTS

| | | | |
|---|---|---|---|
| 2007/0081377 A1 | 4/2007 | Zheng et al. | |
| 2007/0133341 A1 | 6/2007 | Lee et al. | |
| 2008/0220560 A1 | 9/2008 | Klersy | |
| 2009/0055617 A1* | 2/2009 | Bansal et al. | 711/171 |
| 2009/0172315 A1* | 7/2009 | Iyer et al. | 711/158 |
| 2009/0194839 A1 | 8/2009 | Bertin et al. | |
| 2010/0091546 A1 | 4/2010 | Liu et al. | |
| 2010/0171086 A1 | 7/2010 | Lung et al. | |
| 2010/0232203 A1 | 9/2010 | Chung et al. | |
| 2010/0277967 A1 | 11/2010 | Lee et al. | |
| 2010/0301304 A1 | 12/2010 | Chen et al. | |
| 2011/0128772 A1 | 6/2011 | Kim et al. | |
| 2011/0145777 A1* | 6/2011 | Iyer et al. | 716/132 |
| 2011/0297912 A1 | 12/2011 | Samachisa et al. | |
| 2011/0312166 A1 | 12/2011 | Yedinak et al. | |
| 2012/0044737 A1 | 2/2012 | Chung | |
| 2012/0044738 A1 | 2/2012 | Chung | |
| 2012/0044739 A1 | 2/2012 | Chung | |
| 2012/0044740 A1 | 2/2012 | Chung | |
| 2012/0044743 A1 | 2/2012 | Chung | |
| 2012/0044744 A1 | 2/2012 | Chung | |
| 2012/0044745 A1 | 2/2012 | Chung | |
| 2012/0044746 A1 | 2/2012 | Chung | |
| 2012/0044747 A1 | 2/2012 | Chung | |
| 2012/0044748 A1 | 2/2012 | Chung | |
| 2012/0044753 A1 | 2/2012 | Chung | |
| 2012/0044756 A1 | 2/2012 | Chung | |
| 2012/0044757 A1 | 2/2012 | Chung | |
| 2012/0044758 A1 | 2/2012 | Chung | |
| 2012/0047322 A1 | 2/2012 | Chung | |
| 2012/0106231 A1 | 5/2012 | Chung | |
| 2012/0147653 A1 | 6/2012 | Chung | |
| 2012/0147657 A1 | 6/2012 | Sekar et al. | |
| 2012/0209888 A1 | 8/2012 | Chung | |
| 2012/0224406 A1 | 9/2012 | Chung | |
| 2012/0320656 A1 | 12/2012 | Chung | |
| 2012/0320657 A1 | 12/2012 | Chung | |

OTHER PUBLICATIONS

U.S. Appl. No. 13/026,650, filed Jan. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/471,704, filed May 15, 2012.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/571,797, filed Aug. 10, 2012.
U.S. Appl. No. 13/590,044, filed Aug. 20. 2012.
U.S. Appl. No. 13/590,047, filed Aug. 20. 2012.
U.S. Appl. No. 13/590,049, filed Aug. 20. 2012.
U.S. Appl. No. 13/590,050, filed Aug. 20. 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.

Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb, 1994, pp. 204-211.
Banerjee, Kaustav et al., "High Current Effects in Silicide Films for Sub-0.25um VLSI Technologies," IEEE $36^{th}$ IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "SET and RESET Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), $16^{th}$ Asia and South Pacific, 2011, pp. 197-203.
Cheng, Yu-Hsing et al., "Failure Analysis and Optimization of Metal Fuses for Post Package Trimming," IEEE $45^{th}$ IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A $1.25um^2$ Cell 32Kb Electrical Fuse Memory in 32nm CMOS with 700mV Vddmin and Parallel/Serial Interface," VLSI Cir. Symp., Jun. 2009, pp. 30-31.

(56) References Cited

OTHER PUBLICATIONS

Chung, S. et al., "A 512×8 Electrical Fuse Memory with 15um² Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi² Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawhara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um² 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um² U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec, 2003, pp. 255-258.
Lee, H.Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.

(56) References Cited

OTHER PUBLICATIONS

Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.

Morimoto, T. et al., "A NiSi Salicide Technology for Advanced Logic Devices," IEEE IEDM, Dec. 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec. 2006, pp. 1-4.

Osada, K. et al., "Phase Change RAM Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. on Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile IT Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.

Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.

Rizzolo, R. F. et al., "IBM System z9 eFUSE applications and methodology," IBM J. Res. & Dev. vol. 51 No. 1/2 Jan./Mar. 2007, pp. 65-75.

Robson, Norm et al., "Electrically Programmable Fuse (eFUSE) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.

Safran, J. et al., "A Compact eFUSE Programmable Array Memory for SOI CMOS," VLSI Cir. Symp. Jun. 2007, pp. 72-73.

Sasaki, Takahiko et al., "Metal-Segregate-Quench Programming of Electrical Fuse," IEEE 43rd IRPS, 2005, pp. 347-351.

Schrogmeier, P. et al., "Time Discrete Voltage Sensing and Iterative Programming Control for a $4F^2$ Multilevel CBRAM," VLSI Cir. Symp., Jun. 2007, pp. 186-187.

Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

Sheu, Shyh-Shyuan et al., "Fast-Write Resistive RAM (RRAM) for Embedded Applications," IEEE Design & Test of Computers, Jan./Feb. 2011, pp. 64-71.

Shi, Min et al., "Zero-Mask Contact Fuse for One-Time-Programmable Memory in Standard CMOS Processes," IEEE Dev. Lett. vol. 32, No. 7, Jul. 2011, pp. 955-957.

Song, Y. J. et al., "Highly Reliable 256Mb PRAM with Advanced Ring Contact Technology and Novel Encapsulating Technology," IEEE VLSI Tech Symp., Jun. 2006, pp. 153-154.

Suto, Hiroyuki et al., "Programming Conditions for Silicided Poly-Si or Copper Electrically Programmable Fuses," IEEE IIRW Final Report, 2007, pp. 84-89.

Suto, Hiroyuki et al., "Study of Electrically Programmable Fuses Through Series of I-V Measurements," IEEE IIRW Final Report, 2006, pp. 83-86.

Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.

Takaoka, H. et al., A Novel Via-fuse Technology Featuring Highly Stable Blow Operation with Large On-off Ratio for 32nm Node and Beyond, IEDM, 2007, pp. 43-46.

Tehrani, S. et al., "Magnetoresistive Random Access Memory Using Magnetic Tunnel Junction," Proc. of IEEE, vol. 91, No. 5, May 2003, pp. 703-714.

Tehrani, S., "Status and Outlook of MRAM Memory Technology," IEEE IEDM Dig. of Tech Paper., Dec. 2006, pp. 1-4.

Teichmann, J. et al., "One Time Programming (OTP) with Zener Diodes in CMOS Processes," 33rd Conf. on European Solid-State Device Research (ESSDERC), 2003, pp. 433-436.

Tian, C. et al., "Reliability Investigation of NiPtSi Electrical Fuse with Different Programming Mechanisms," IEEE IIRW Final Report, 2007, pp. 90-93.

Tian, C. et al., "Reliability Qualification of CoSi2 Electrical Fuse for 90nm Technology," IEEE 44th IRPS, 2006, pp. 392-397.

Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.

Tonti, W. R. et al., "Product Specific Sub-Micron E-Fuse Reliability and Design Qualification," IEEE IIRW Final Report, 2003, pp. 36-40.

Tonti, W. R., "Reliability and Design Qualification of a Sub-Micro Tungsten Silicide E-Fuse," IEEE IRPS Proceedings, 2004, pp. 152-156.

Tonti, W. R., "Reliability, Design Qualification, and Prognostic Opportunity of in Die E-Fuse," IEEE Conference on Prognostics and Health Management (PHM), 2011, pp. 1-7.

Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.

Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.

Vimercati, Daniele et al., "A 45nm 1Gbit 1.8V PCM for Wireless and Embedded Applications," IEEE ISSCC Feb. 2010, 26 pages.

Vinson, J. E., "NiCr Fuse Reliability—A New Approach," Southcon/94, Conference Record, 1994, pp. 250-255.

Walko, J., "Ovshinsky's Memories," IEE Review, Issue 11, Nov. 2005, pp. 42-45.

Wang, J. P. et al., "The Understanding of Resistive Switching Mechansim in HfO2—Based Resistive Random Access Memory," IEDM, 2011, pp. 12.1.1-12.1.4.

(56) References Cited

OTHER PUBLICATIONS

Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for $Cu_xO$ based RRAM Cell," $9^{th}$ Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,704, mailed Apr. 30, 2013.

* cited by examiner

CIRCUIT AND METHOD OF A MEMORY COMPILER BASED ON SUBTRACTIVE APPROACH

CROSS-REFERENCE TO RELATED APPLICATIONS

This application claimed priority benefit of U.S. Provisional Patent Application No. 61/443,172 filed on Feb. 15, 2011, titled "Circuit and Method of a One-Time Programmable Memory Compiler Based on Subtraction Approach", which is hereby incorporated herein by reference.

This application also references U.S. Provisional Patent Application No. 61/375,653, filed on Aug. 20, 2010 and entitled "Circuit and System of Using Junction Diode As Program Selector for Resistive Devices in CMOS Logic Processes," which is hereby incorporated herein by reference; U.S. patent application Ser. No. 13/026,725 filed on Feb. 11, 2011 based on the same title, which is hereby incorporated herein by reference; U.S. Provisional Patent Application No. 61/375,660, filed on Aug. 20, 2010 and entitled "Circuit and System of Using Polysilicon Diode As Program Selector for Resistive Devices in CMOS Logic Processes," which is hereby incorporated herein by reference; U.S. patent application Ser. No. 13/026,650 filed on Feb. 11, 2011 based on the same title, which is hereby incorporated herein by reference.

This application also claimed priority benefit of U.S. Provisional Patent Application No. 61/421,184 filed on Dec. 8, 2010, titled "Method and Apparatus of A High Density Antifuse," and a U.S. patent application Ser. No. 13/314,444 filed on Dec. 7, 2011 based on the same title, which is also hereby incorporated herein by reference.

BACKGROUND OF THE INVENTION

1. Field of the Invention

The present invention relates to a memory compiler and, more particularly, circuit and method to build a memory compiler based on pre-built memory templates of maximum capacities with array size reduction and component subtraction.

2. Description of the Related Art

Memory compiler is a tool to generate memories with various configurations, such as different capacities, different I/O counts, different aspect ratios, etc. by software automation. The conventional method to build a compiler is based on an additive approach or tiling, which means all basic components of a memory are pre-built and then tiled together seamlessly like tiling on the kitchen floor by running a software.

Compilers to generate datapath, such as adders or multipliers, or to generate register files is a very simple example of tiling. As an example to generate an 8-bit, 16-bit, 32-bit, or 64-bit adder, each bit cell is pre-designed and pre-layouted. The cells of carry look-ahead or carry select for every 4 bits can also be pre-designed and pre-layouted. Then a simple layout script or a software script tiles the bit slices together with carry look-ahead or carry select circuit between 4-bit cells to generate the required adder. Register file is another simple example for tiling. The bit cells, X-decoders, and column sense amplifiers can be put together to generate the required register file with arbitrary capacities and configurations.

ROM or SRAM compilers are another two common types of memory compilers that need a general purpose software rather than simple scripts to generate. A ROM or SRAM has memory bit cells, X-decoders, Y-decoders, X- and Y-address buffers, X- and Y-pre-decoders, bitline pull-ups, Y-select pass gates, sense amplifiers, output buffers, and control logic, etc. Those components need more sophisticated software to tile various components together to generate various configurations, such as capacities, I/Os, aspect ratios, on different technologies, etc.

FIG. 1 shows a portion of a typical ROM/SRAM compiler 100 based on tiling according to a prior art. The memory bit cell 105 is built and organized as an n×m two-dimensional memory array 110 by tiling all bit cells together. Then, n X-decoders 115 are tiled and butted to the left of the memory array 110 with the height of the X-decoders 115 fitted into the height of the bit cells 105. Similarly, m Y-decoders 120 are tiled and butted to the bottom of the memory array 110 with the width of the Y-decoders fitted into the width of the bit cell 105. The X- and Y-decoders are called tight-pitch cells that need to fit into the pitches of the bit cells 105, otherwise the area utilization would be very poor. S columns are multiplexed into one I/O so that one sense amplifier 125 has a width to match the width of s bit cells 105. If there are t sense amplifiers 125 in the memory 100 and one sense amplifier fitting into the width of s cells, then the total number of column in the memory 100 is m=s*t. Output buffers 130 are tiled to the bottom of the sense amplifier 125, one for one. All X- and Y-addresses need to be properly buffered and then pre-decoded to generate the required X- and Y-decoder signals. The X-address buffers 135 and X-pre-decoders 140 are built and generally fitted into the left-lower corner in the floor plan. So do the Y-address buffers 145 and Y-pre-decoders 150. Then the read/write control logic 195 is built to fit into the left over space in the left-lower corner of the memory macro 100. All components are tiled with perfect matches in the boundaries to prevent wasting valuable silicon real estate. Finally, a power/ground ring (not shown in FIG. 1) is built around the whole memory macro 100 to complete the memory compiled.

The above compiler method is only good for a simple memory such as ROM or SRAM. For a DRAM or flash memory, the components are much more and complicated. For example, flash memory tends to need high voltage generators, reference voltages, tighter pitches but with high-voltage devices in the X- and Y-decoders to fit. As a result, they tend to build manually, rather than generated by software automatically.

Building memories with different configurations manually requires lots of time, efforts, and financial resources to do. Moreover, it would be subject to human errors, that may carry great financial and legal liability. Accordingly, there is a need for building a general-purpose memory compiler for those memories that are more complicated than either ROM or SRAM to save costs.

SUMMARY OF THE INVENTION

The invention pertains to a circuit and method to build a general-purpose memory compiler based on building a template of memory with maximum capacity and then subtracting some components to generate smaller memories.

The conventional way to build a memory compiler is based on additive approach, which means starting with a memory bit cell to tile into a memory array with tight-pitch cells, and then the control logic for a memory macro. If the memory is more complicated than either ROM or SRAM, there are some other circuits such as reference voltages, high voltage generators, memory redundancy, test mode circuits, etc. to build. Those circuits are not as regular as the memory components so that they are very hard to tile into proper space.

This invention about building a memory compiler is based on subtractive approach, which means starting with a template of memory with maximum capacity and then gradually subtracting some components to generate smaller capacity memories. Since all various irregular components are built in the template, no efforts spent to tile these components into proper area with a perfect fit. On the contrary, taking away some components is much easier than putting various components together in perfect match. One-time Programmable (OTP) memory can be used to illustrate the circuit and concept of the subtractive memory compiler, though the other type of memories such as DRAM or flash memories can be applicable too. The OTP memory cell generally has an OTP element, such as a polysilicon in an electrical fuse cell or a dielectric film in an anti-fuse cell, coupled to a diode as a program selector.

FIG. 2 shows a block diagram of a portion of memory 200 built manually, as an example of a finished memory macro. The memory macro has been design to optimize performance and silicon area. The memory 200 has a memory array 210 that has n×m memory cell 205 organized in two-dimensional. To the left of the memory array 210, there are n X-decoders 215 to provide wordlines to fit into the height of the memory cell 205. To the bottom of the memory array 210, there are m Y-decoders and Y-Pass gates 220 to fit into the width of the memory cell 205. One sense amplifier 225 can be coupled into s Y-decoders and fitted to the bottom of the Y-decoders. An output buffer 230 is coupled to the output of the sense amplifier 225 and fitted below in the layout. Their widths should match perfectly. To the left of the Y-decoder 220 and below the X-decoders 215, there are interpose of X-/Y-pre-decoders, and X-/Y-address buffers, 235, 250, 240, and 245 respectively to fit into the available space. In a manual design, the widths and heights of the X-/Y-pre-decoders, and X-/Y-address buffers, 235, 250, 240, and 245 need to go through several iterations of changing aspect ratios so that tight fittings can be achieved. A control logic 295 can be designed to fit into the available space in the lower left corner of the memory 200. To design a memory macro without too much empty space needs craftsmanship, which means need experienced circuit and layout designers spending time and efforts to practice to master the skill. At least one power/ground rings surround the memory macro 200 to provide low resistance paths in the supply voltage lines.

FIG. 3 shows a schematic of an OTP memory cell 800 with an OTP element 801 and a diode 810 as program selector. The OTP element 801 can be an electrical fuse, such as silicided polysilicon, coupled to a first supply voltage line V+ and to the P terminal of a diode 810. The diode 810 has an N terminal coupled to a second supply voltage line V−. The diode can be constructed from a junction diode created from a P+/N well or a polysilicon diode built on a polysilicon structure with N+ and P+ implants in two ends and a silicide block layer to separate the N+ and P+ regions in standard CMOS processes. Similarly, a diode can also be a diode built on an isolated active-region structure with N+ and P+ implants in two ends and a silicide block layer to separate the N+ and P+ regions in standard SOI or FinFET processes.

FIG. 4(a) shows a cross section of an array 900 of anti-fuse cells as one particular type of OTP memory cell. Anti-fuse cells are formed at the cross-points of two perpendicular conductors with a dielectric film as OTP element and a P/N junction diode as program selector. Parallel active region lines 912 are fabricated on P type substrate 910 with oxide isolation, such as STI (Shallow Trench Isolation) or LOCOS (Local Oxidation) 911, in between. The active region lines 912 are implanted with heavy N+, the so-called buried N+ implant, to create a conductor before polysilicon or source/drain of CMOS can be formed. The active region lines 912 are implanted with P type dopant 930 over the buried N+ 920 to create a P/N junction diode and then grow a thin oxide 935 before another set of P type polysilicon lines 940 are fabricated on top running in a perpendicular direction. An anti-fuse cell is created at the cross-point of the polysilicon 940 and active region lines 912. Another embodiment in constructing a diode is to use an intrinsic layer between P type implant 930 and buried N+ 920. The intrinsic layer means not intentionally doped with N or P type, but rather can be slightly N or P type due to out-diffusion or contamination.

FIG. 4(b) shows an equivalent circuit of the anti-fuse cell in FIG. 4(a). An anti-fuse cell 945 is created at the cross-point of the polysilicon 930 and active region lines 912 having an oxide layer 941 as a dielectric film and a diode 942 as a program selector. The oxide layer 941 is fabricated before the polysilicon lines 930 in FIG. 4(a), and is coupled to a first supply voltage line V+ and to the P terminal of a diode 942 in FIG. 4(b). The N terminal of the diode 942 is coupled to an active region 912 in FIG. 4(a) and further coupled to a second supply voltage line V− in FIG. 4(b).

FIG. 5 shows a schematic of a portion of OTP memory cells organized as an n×m two-dimensional array 950. The OTP memory cell 951 has an OTP element 952, which can be a polysilicon in an electrical fuse cell or a dielectric film in an anti-fuse cell, and a diode 953 as program selector. The OTP element 952 is coupled to a first supply voltage V+ in one end and to a P terminal of a diode 953 at the other end. The diode 953 has an N terminal coupled to a second supply voltage V− at the other end. The OTP memory cells are organized as an n×m array with all V+'s of the cells in the same column connected as bitlines BLj (j=0, 1, 2, . . . , m−1), and all V−'s of the cells in the same row connected as wordlines WLi (i=0, 1, 2, . . . , n−1). An OTP cell located at I'th row and j'th column can be selected for read or write by asserting the WLi and BLj, where i=0, 1, 2, . . . , n−1 and j=0, 1, 2, . . . , m−1.

The invention can be implemented in numerous ways, including as a method, system, device, or apparatus (including graphical user interface and computer readable medium). Several embodiments of the invention are discussed below.

As a memory compiler, one embodiment can, for example, include a plurality of memory cells. At least one of the memory cells can include an OTP element coupled to a first supply voltage line, and a diode including at least a first type of silicon and a second type of silicon. The first type of silicon can have a first type of dopant and the second type of silicon can have a second type of dopant. An intrinsic layer may be inserted between the first and the second types of silicon. The first type of silicon can provide a first terminal of the diode and the second type of silicon can provide a second terminal of the diode. The first type of silicon can also be coupled to the OTP element, and the second type of silicon can be coupled to a second supply voltage line. The diode can be fabricated as a junction diode or a diode constructed from a polysilicon structure in standard CMOS processes, or an isolated active-region in standard SOI or FinFET processes. Alternatively, a memory cell can be built at the cross-points of two perpendicular conductors, such as metal-active region, active-polysilicon, or metal-polysilicon, etc. The OTP element can be a polysilicon in an electrical fuse cell or a dielectric film in an anti-fuse cell. The OTP element can be configured to be programmable by applying voltages to the first and second supply voltage lines to thereby change the resistance of the OTP element into a different logic state. Alternatively, the OTP element, such as a dielectric film, can be coupled to the second type of silicon, or in between the first and the second type of silicon in other embodiments.

As an electronics system, one embodiment can, for example, include at least a processor, and a compiled OTP memory operatively connected to the processor. The compiled OTP memory can include at least a plurality of OTP memory cells for providing data storage. Each of the OTP cells can include at least an OTP element coupled to a first supply voltage line, and a diode including at least a first type of silicon and a second type of silicon. The first type of silicon can have a first type of dopant and the second type of silicon can have a second type of dopant. An intrinsic layer may be inserted between the first and the second types of silicon. The first type of silicon can provide a first terminal of the diode and the second type of silicon can provide a second terminal of the diode. The first type of silicon can be coupled to the OTP element and the second type of silicon can be coupled to a second supply voltage line. The first and second type of silicons can be fabricated as a junction diode or a diode constructed from a polysilicon structure in standard CMOS processes, or an isolated active-region in standard SOI or FinFET processes. Alternatively, an OTP cell can be built at the cross-point of two perpendicular conductors, such as metal-active region, active-polysilicon, or metal-polysilicon, etc. The OTP element can be a polysilicon in an electrical fuse cell or a dielectric film in an anti-fuse cell. The OTP element can be configured to be programmable by applying voltages to the first and the second supply voltage lines to thereby change the resistance of the OTP element into a different logic state. Alternatively, the OTP element, such as a dielectric film, can be coupled to the second type of silicon, or in between the first and the second type of silicon in other embodiments.

As a method for providing an OTP memory from a memory compiler, one embodiment can, for example, include at least providing a plurality of OTP memory cells, and programming a logic state into at least one of the OTP cells by applying voltages to the first and the second voltage lines. The at least one of the OTP cells can include at least (i) a OTP element coupled to a first supply voltage line, and (ii) a diode including at least a first type of silicon and a second type of silicon. The first type of silicon can have a first type of dopant and the second type of silicon can have a second type of dopant. An intrinsic layer may be inserted between the first and the second types of silicon. The first type of silicon can provide a first terminal of the diode and the second type of silicon can provide a second terminal of the diode. The first type of silicon can be coupled to the OTP element and the second type of silicon can be coupled to a second supply voltage line. The first and second type of silicons can be fabricated from a junction diode or a diode constructed from a polysilicon structure in standard CMOS processes, or an isolated active-region in standard SOI/FinFET processes. Alternatively, a memory cell can be built at the cross-point of two perpendicular conductors, such as metal-active region, active-polysilicon, or metal-polysilicon, etc. The OTP element can be a polysilicon in an electrical fuse cell or a dielectric film in an anti-fuse cell. The OTP element can be configured to be programmable by applying voltages to the first and the second supply voltage lines to thereby change the resistance of the OTP element into a different logic state. Alternatively, the OTP element, such as a dielectric film, can be coupled to the second type of silicon, or in between the first and the second type of silicon in other embodiments.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF THE INVENTION

This invention is about a memory compiler based on subtractive method that can be applied to any kinds of memory. By building a full-function memory with maximum capacity as a template, smaller size memories can be generated by reducing the memory array size and the associated tight-pitch cells accordingly. The memory macro boundary can also be stretched to fit into the new floor plan of the smaller memory. Some addresses would be disabled in the new and smaller size memories. This compiler method can be applied to any memories with more components and complicated circuits, though an OTP compiler is used as an example to illustrate the key concept of this invention.

Figure 6A:
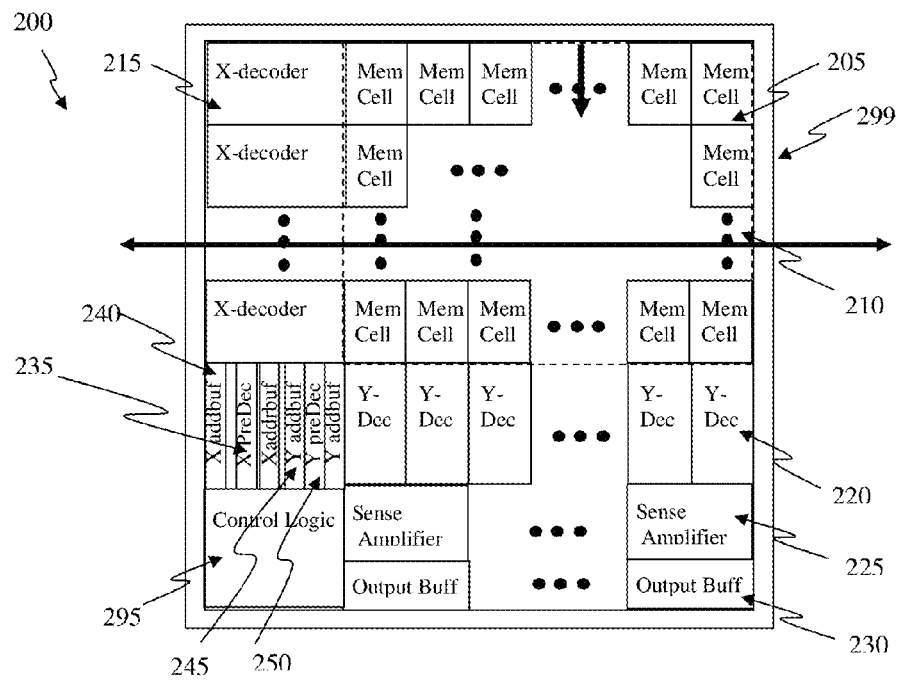
FIG. 6(a) shows a method of building a smaller memory along the row direction by a subtractive method.

FIG. 6(a) shows a layout floor plan of a memory 200. The memory 200 has an array of n×m memory cells 205 organized in a two-dimensional array 210. An array of n X-decoders 215 are placed and butted to the memory array 210 in the left. Another array of m Y-decoders 220 are placed and butted to the memory array 210 in the bottom. An array of sense amplifiers 225 with the width fitted into the width of memory cells are placed and butted to the Y-decoders in the bottom. If there are t sense amplifiers in this memory 200, then m=t*s. In one embodiment, there could be only one sense amplifier for the entire memory. X-address buffers 240 and X pre-decoders 235 are placed in the left lower corner of the memory 200. So are the Y-address buffers 245 and Y pre-decoders 250. A control logic 295 is built to fit into the left lower corner of the memory macro 200 in the floor plan. Finally, a power or ground ring 299 is built around the memory macro 200 to reduce the power or ground resistance.

Figure 6B:
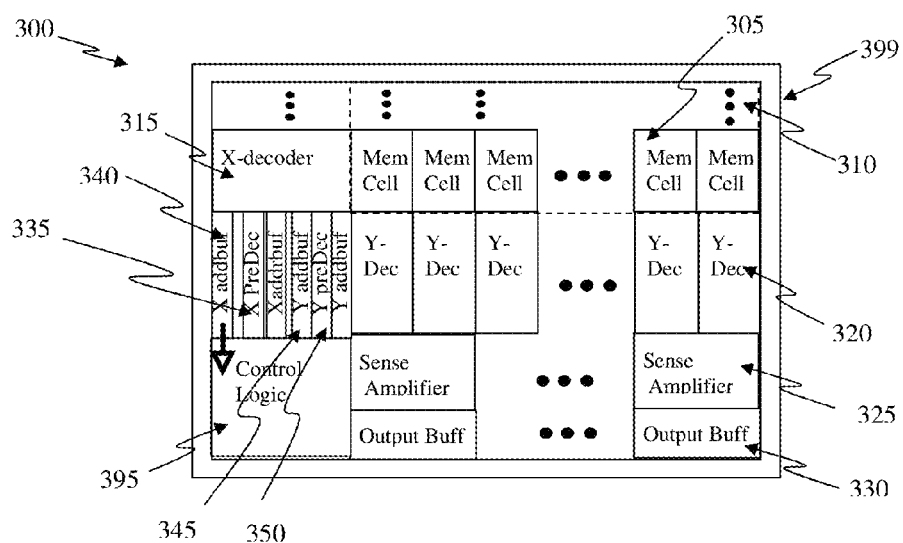
FIG. 6(b) shows a final floor plan of building a smaller compiled memory along the row direction by a subtractive method.

To build a smaller size memory 300 based on the maximum capacity memory 200 in FIG. 6(a), the memory bit cells and the X-decoders above the bold line shown in FIG. 6(a) can be eliminated. The number of rows can be reduced to one-half, one quarter, or one eighth, etc. The corresponding X-address buffers (i.e. high order X-address buffers) are disabled and grounded. Reducing the number of rows by 2's powers makes the decoding scheme much easier, though it is not necessary to be in 2's powers. The power or ground ring 299 of a memory 200 in FIG. 6(a) can be stretched to fit into the new floor plan of the memory as shown in an arrow in bold. The final floor plan of the new memory 300 is shown in FIG. 6(b). This process can be automated much easier by using software or scripts operating on layout database.

Figure 7A:
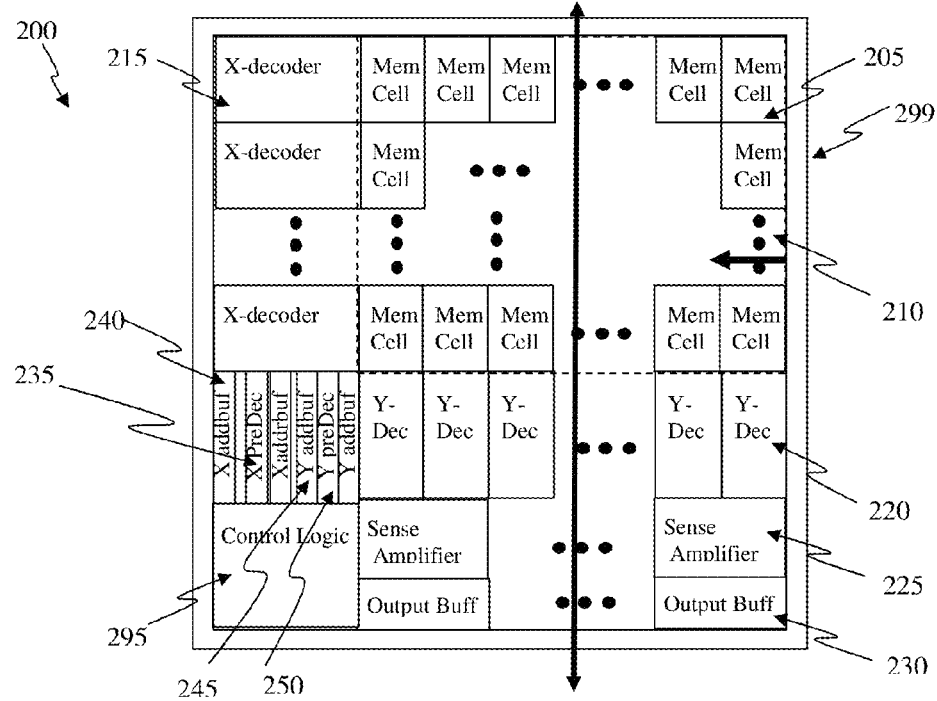
FIG. 7(a) shows a method of building a smaller memory along the column direction by a subtractive method

FIG. 7(a) shows a layout floor plan of a memory 200. The memory 200 has an array of n×m memory cells 205 organized in a two-dimensional array 210. An array of n X-decoders 215 are placed and butted to the memory array 210 in the left. Another array of m Y-decoders 220 are placed and butted to the memory array 210 in the bottom. An array of sense amplifiers 225 with the width fitted into the width of memory cells are placed and butted to the Y-decoders in the bottom. If there are t sense amplifiers in this memory, then m=t*s. In one embodiment, there could be only one sense amplifier for the entire memory. X-address buffers, 240 and X pre-decoders 235 are placed in the left lower corner of the memory 200. So are the Y-address buffers 245 and Y pre-decoders 250. A control logic 295 is built to fit into the left lower corner of the memory macro 200 in the floor plan. Finally, a power or ground ring 299 is built around the memory macro 200 to reduce the power or ground resistance.

Figure 7B:
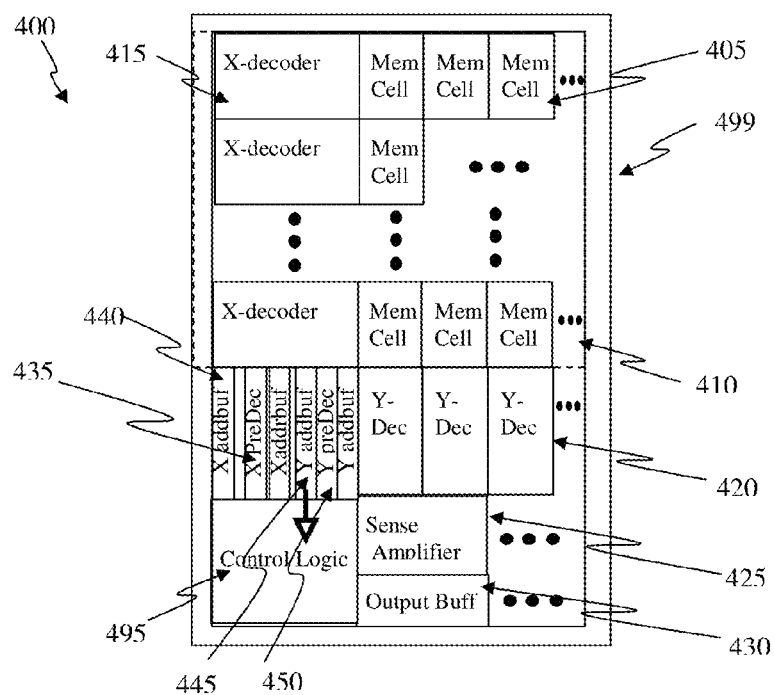
FIG. 7(b) shows a final floor plan of building a smaller compiled memory along the column direction by a subtractive method.

To build a smaller size memory 400 based on the maximum capacity memory 200 in FIG. 7(a), the memory bit cells and the Y-decoders to the right of the bold line shown in FIG. 7(a) can be eliminated. The number of columns can be reduced to one-half, one quarter, or one eighth, etc. The corresponding Y-address buffers (i.e. high order Y-address buffers) are disabled and grounded. Reducing the number of columns by 2's power makes the decoding scheme much easier, though it is not necessary to be in 2's powers. The power or ground ring 299 in FIG. 7(a) can be stretched to fit into the new floor plan of the memory as shown in an arrow in bold. The final floor plan of the new memory 400 is shown in FIG. 7(b). This process can be automated much easier by using software or scripts operating on layout database.

Figure 8:
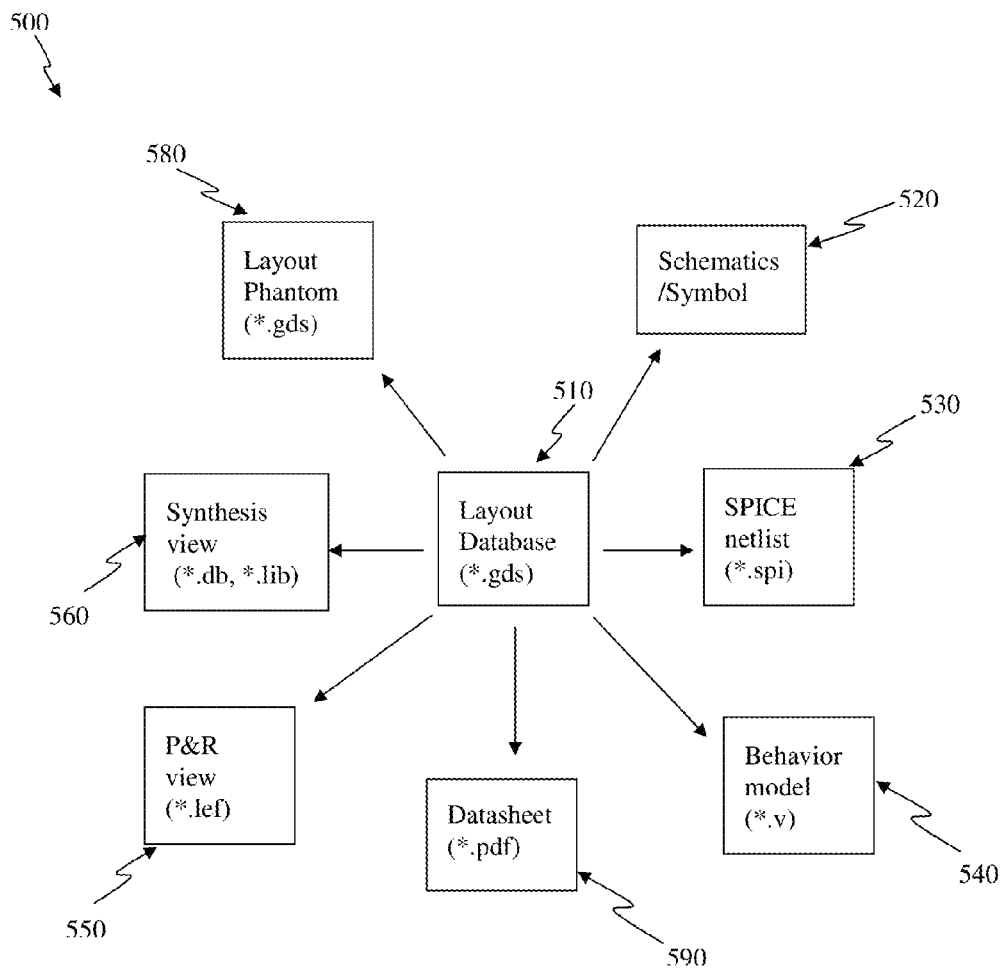
FIG. 8 shows various auxiliary databases of a memory in automated logic flow.

FIG. 8 shows various design databases 500 for a memory macro to be integrated into an SoC according to automated logic flow. The most important file is the layout database 510 (usually in GDS format) that is the physical entity to be integrated with rest of design database for an SoC. However, during the process of designing the memory macro, a set of schematics and symbols 520 (i.e. logic gate and blocks) are built for engineers to design circuits. Building a custom memory macro is the so-called bottom-up design methodology—by starting with basic Boolean gates, building larger and larger blocks with symbols in hierarchy. After the schematics 520 are built in graphics form, the schematics 520 can be converted into SPICE netlist (*.spi) 530 so that the circuits built can be simulated to make sure the functionality and timing are correct and can meet the specifications. After the circuit simulation results are satisfactory, the schematics 520 are hand-drawn into layout database 510 in the memory template. For a memory macro to fit into an SoC, the layout database is a physical database that will go to mask making, while the rest of files are auxiliary for design purposes. The schematics 520, SPICE netlist 530, and layout database 510 are the resulting database of a full custom design.

For a layout database to be integrated into an SoC, some auxiliary files are needed so that an automated logic flow can be applied. The automated logic flow is called top-down design methodology—by writing a Hardware Description Language (HDL), such as Verilog or VHDL, in Register Transfer Level (RTL) to describe the functionality of a target circuit, so that detailed schematics can be generated by synthesis and then linked with a standard cell library for placement-and-routing (P&R) to generate the final layout database. Some auxiliary files are required to describe various aspects of a memory macros in different abstraction levels without needing the physical layout database. For example, to describe the functionality of a macro, a behavior (i.e. *.v file in Verilog format) model specifies the functionality of the macro without considering the detailed implementation and timing. Synthesis means converting RTL files in HDL into schematics with different sizing or buffering to meet functionality and timing constraints. Memory macro is generally not synthesizable but built in full custom design. However, to be integrated into an SoC, a synthesis equivalent model, called synthesis view, needs to be provided for the memory macro so that the rest of the SoC circuits can be synthesized to interface with. For synthesis, such as using Design Compiler of Synopsys, synthesis views (*.db, *.lib) specify the I/O ports with the I/O capacitances, slew rate, timing arcs, or other parameters of the memory macro. Placement and Routing (P&R) means calling leaf cells from a cell library (such as standard cell library), placing them in preferred orders and locations, and then routing them according to specified connectivity. For an automated Placement and Routing (P&R) tool to call the memory macro as a leaf cell and to merge with a cell library for the rest of SoC circuits, a P&R view (*.lef) 550 is needed to specify the connectivity of the I/O ports in physical locations. Finally, a human readable datasheet 690 (i.e. in Adobe *.pdf format) is needed for the SoC designers to understand the specifications of the memory macro. A final physical layout database is usually not needed during SoC design process. A layout phantom 580 is used to specify the boundary of the memory macro with the layers of the I/O ports shown, i.e. a phantom only shows the related layers in boundary of a memory macro for routing purpose but treats the details inside as a black box.

Figure 9:
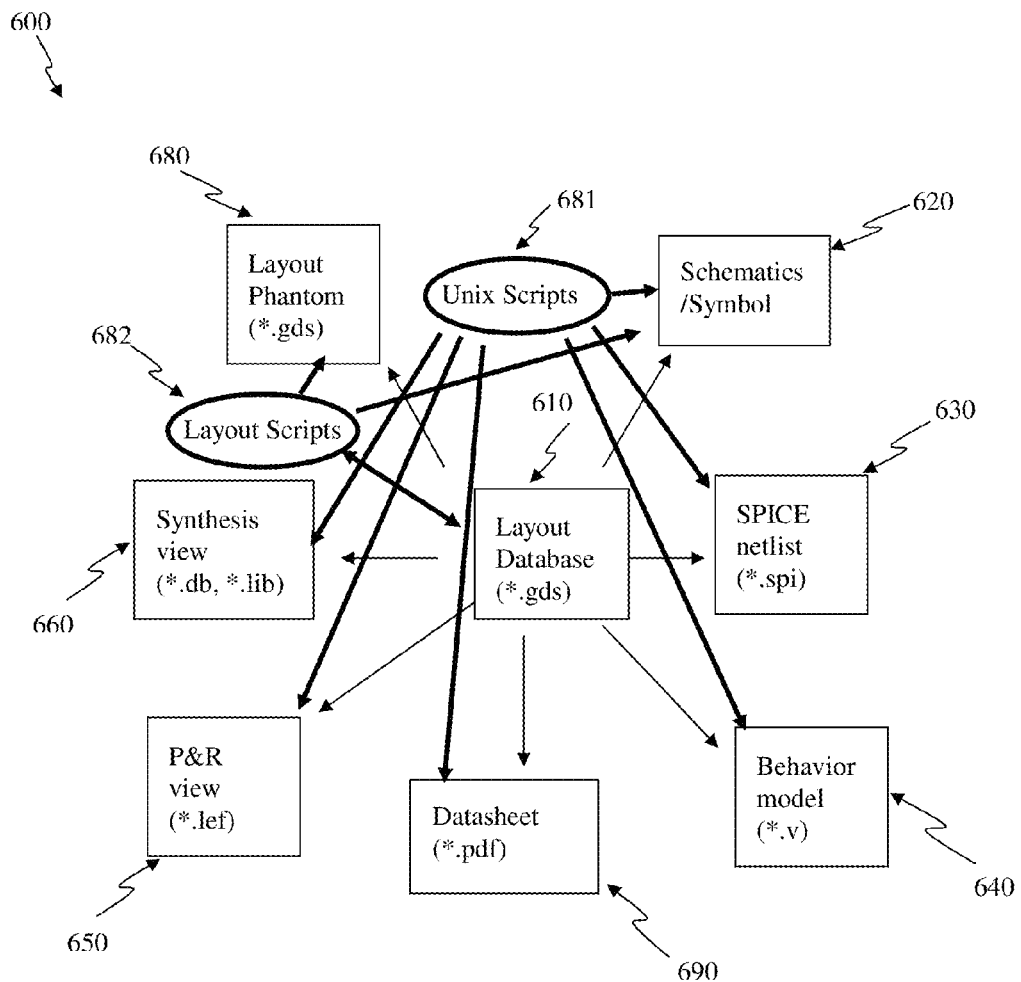
FIG. 9 shows a software or script to generate various auxiliary databases of a memory in automated logic flow.

FIG. 9 shows a block diagram 600 of a software or script to generate various auxiliary database. Layout scripts 682 can be used to generate layout phantom (*.gds) 680 from a layout database 610 by deleting all the layers inside the memory macro to the layers in the boundary and I/O ports for automatic routing. Similarly Unix scripts 681 can be used to generate various design database 620, SPICE netlist 630, Behavior model 640, Synthesis view, P&R view, and datasheet 690, by modifying the numbers of addresses and I/Os, timing parameters, loadings, numbers of instances, etc. from the original auxiliary database, respectively. The modifying is considered very simple that a text-based Unix scripts can do the work.

The scripts to generate various auxiliary files for an SoC to integrate a memory macro compiled from a memory compiler are based on template files. The method to generate layout database has been depicted in FIGS. 6(a), 6(b), 7(a), and 7(b), while the rest of auxiliary files can be generated by either using Unix scripts or layout scripts on a set of template files. The operations on layout database as shown in FIGS. 6(a), 6(b), 7(a), and 7(b) can be easily done by using layout scripts, such as Cadence's Skill Language, to change the array parameters, to move, stretch, add, delete, connect, or disconnect layout objects. Using a general purpose programming language, such as C-language, is possible, but this involves operating on more detailed and more tedious layout objects, while the Skill is a high-level language that wraps all the layout details underneath the language syntax. Similarly, layout phantom 680 can be generated by Skill or C-language accordingly.

The schematics 620 of the newly generated smaller memories can be created by Skill or C-language as well. Usually, the schematics 620 are not necessarily provided with the memory compiler 600, but as a reference to the memory compiler users. The same as the SPICE netlist 630. The SPICE netlist 630, behavior model 640, synthesis view 660 and P&R view 650 are all in human readable text files, so that Unix scripts 681, such as Shell scripts, awk, or Perl, can be used to work on them and to generate similar files for the newly created memories in compiler. The reduced addresses and the new connectivity can be easily modified from the maximum capacity template. The I/O port location, loading, and timing arcs can also be generated from the maximum capacity template with a projection, such as linear extrapolation. The datasheet 690 is a human readable file, such as in Adobe's pdf format, that can be easily modified by Unix scripts based on the template.

Figure 10:
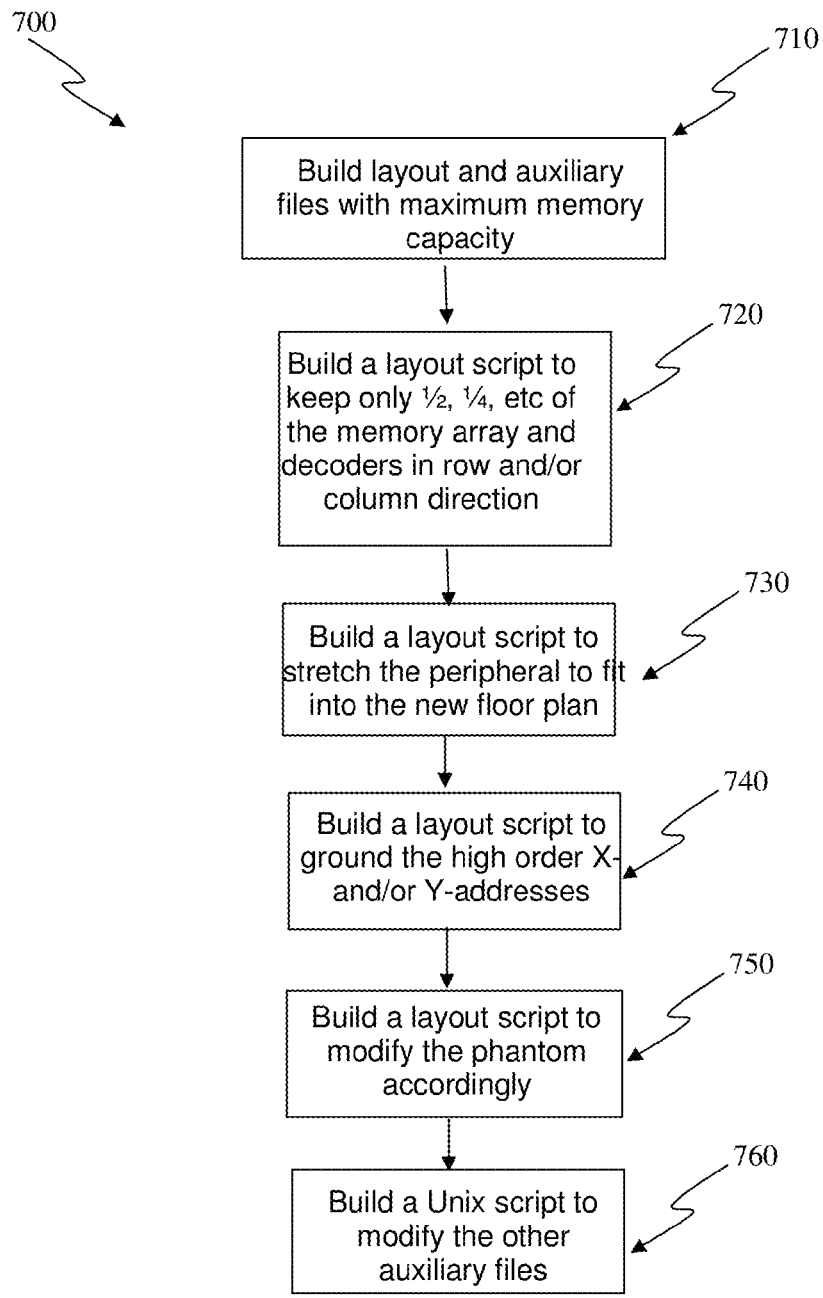
FIG. 10 shows a method to generate auxiliary databases in a memory compiler for automated logic flow.

FIG. 10 shows a method 700 in a flow chart to generate a memory from a memory compiler according to the present invention. The first step 710 is to build a memory template with the maximum capacity for a set of memories to be generated. The memory template has a layout database and all the auxiliary files for customer design and for automated logic flow. Then building a layout script 720 to keep only one half, one quarter, or one-eighth, etc, of the memory array in row and/or column directions. The associated row and/or column decoders are also reduced accordingly. The third step 730 is to build a layout script to stretch the peripheral of the memory array to fit into the new floor plan. The fourth step 740 is to disable or ground the high-order X- and/or Y-addresses so that the other portions of the memory are not needed in the new smaller memories. Then in step 750 a layout script can be created to modify the layout phantom accordingly. The last step 760 is to build at least one Unix, or Unix-like scripts to modify the other auxiliary files based on address reduction, loading and timing arcs by interpolation or extrapolation.

Figure 1:
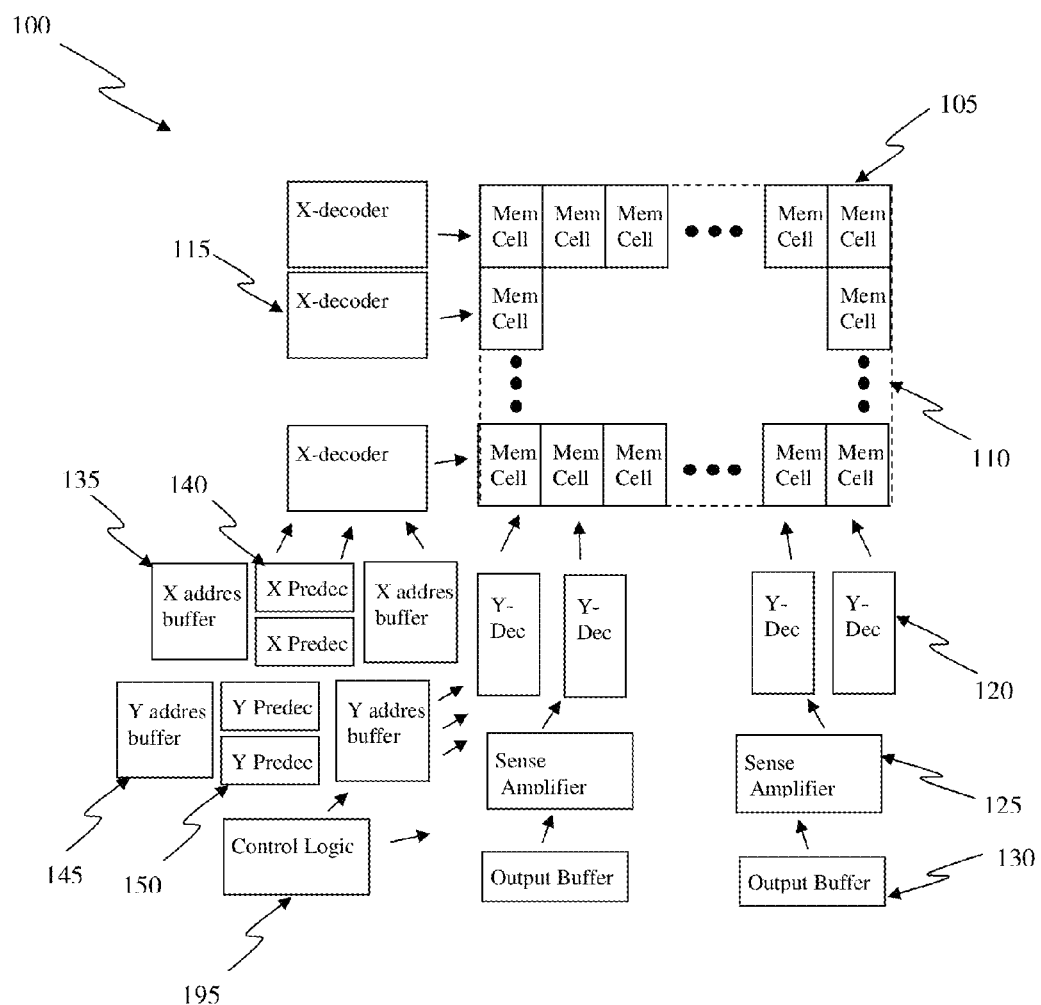
FIG. 1 shows a conventional method to build a memory compiler (prior art).
Figure 2:
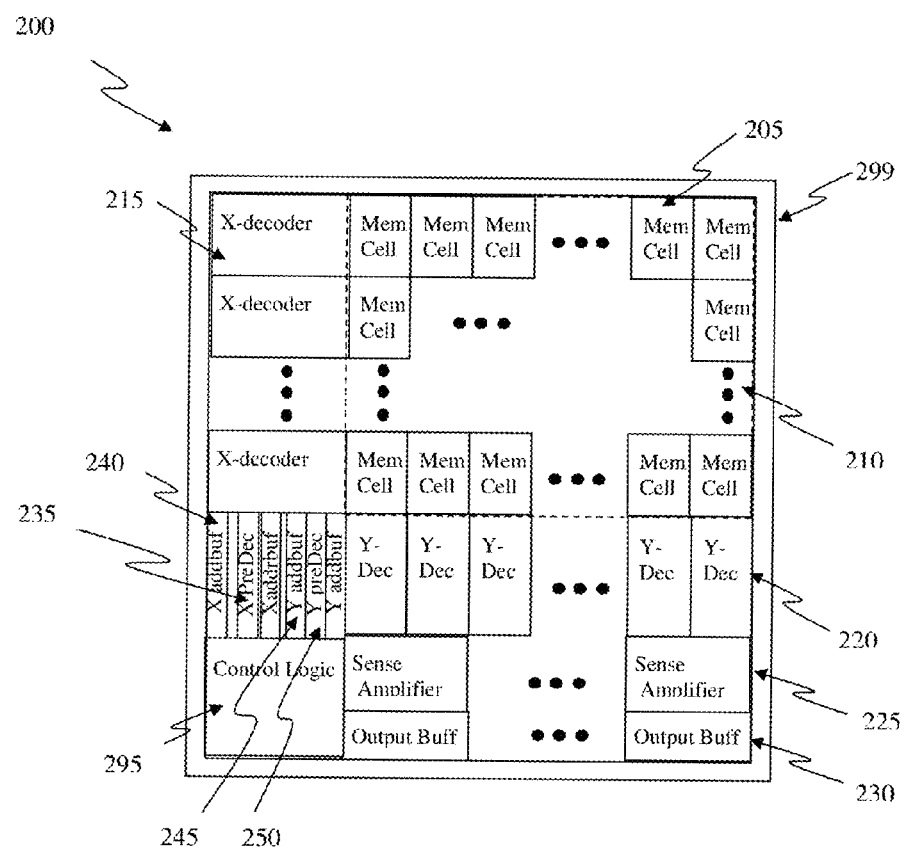
FIG. 2 shows a block diagram of a memory built with various components.
Figure 3:
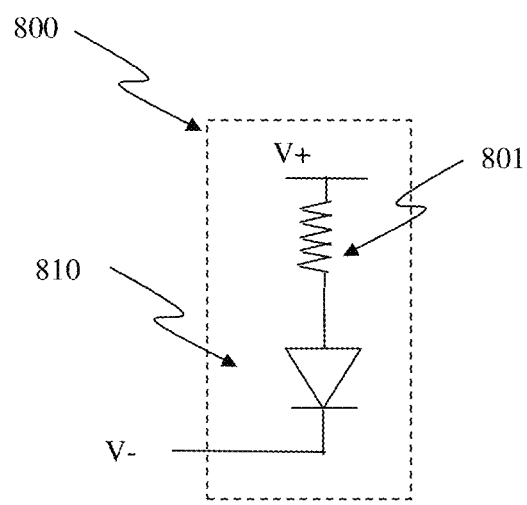
FIG. 3 shows an OTP memory cell with an OTP element and a diode as program selector.
Figure 4A:
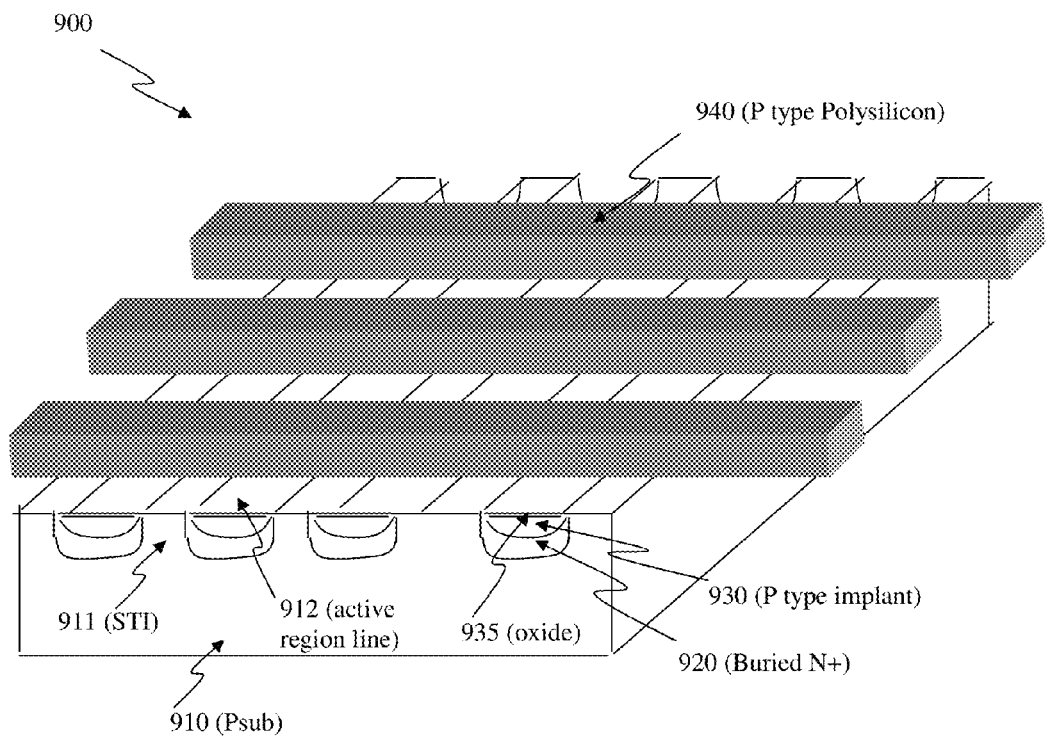
FIG. 4(a) shows a cross section of an anti-fuse cell array as a particular type of OTP memory array with a dielectric film and a diode at the cross points of two perpendicular conductors.
Figure 4B:
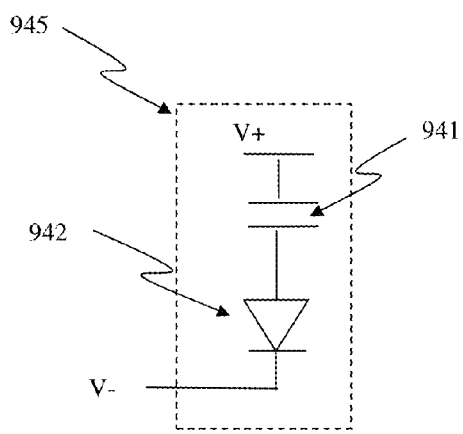
FIG. 4(b) shows an equivalent circuit of the OTP memory cell in FIG. 4(a).
Figure 5:
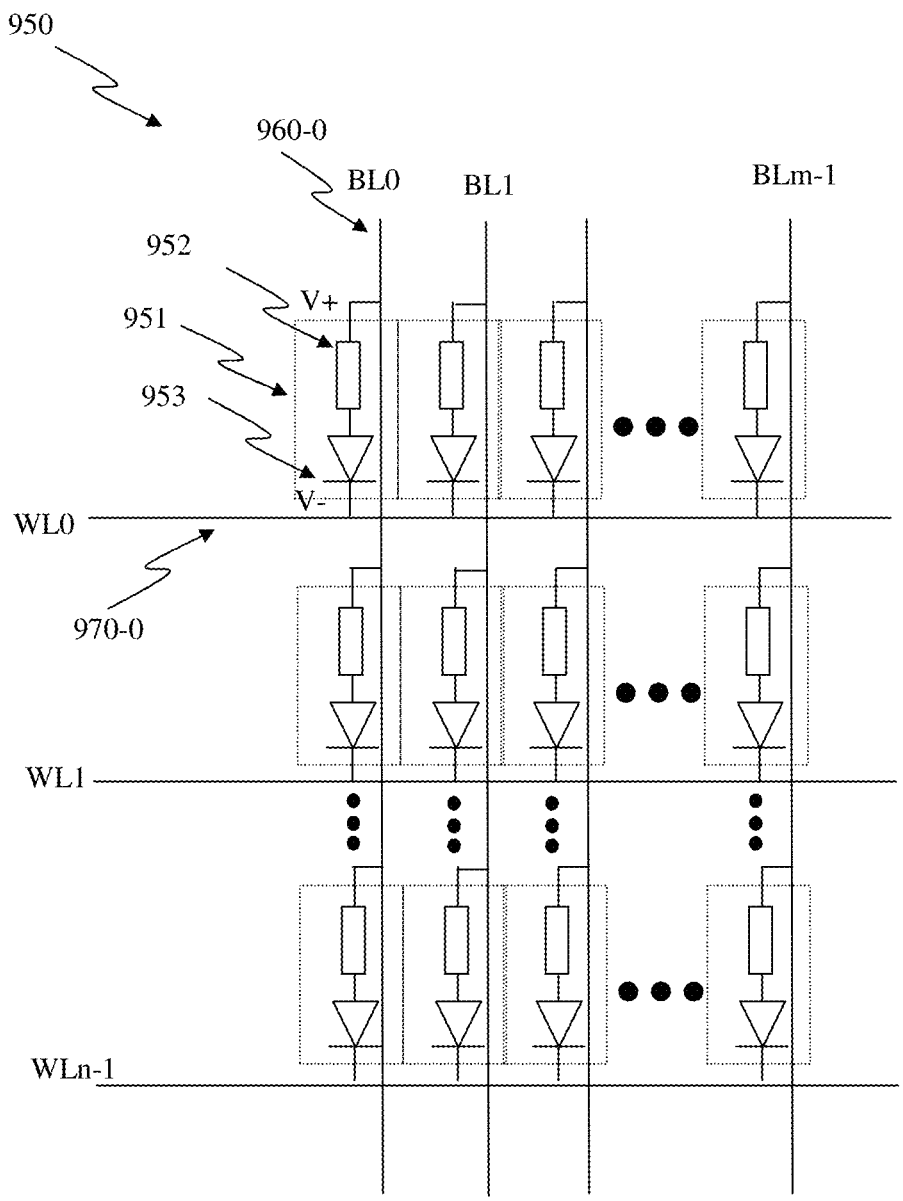
FIG. 5 shows a schematic of building a two-dimensional array using OTP memory cell.

FIG. 10 show flow charts depicting a method of a memory compiler to generate layout and auxiliary database for smaller memory based on a template, in accordance with certain embodiments. The method is described in the context a memory, such as the OTP memory 200 in FIGS. 2, 6(*a*), and 7(*a*). In addition, although described as a flow of steps, one of ordinary skilled in the art will recognize that at least some of the steps may be performed in a different order, including simultaneously, or skipped.

Figure 11:
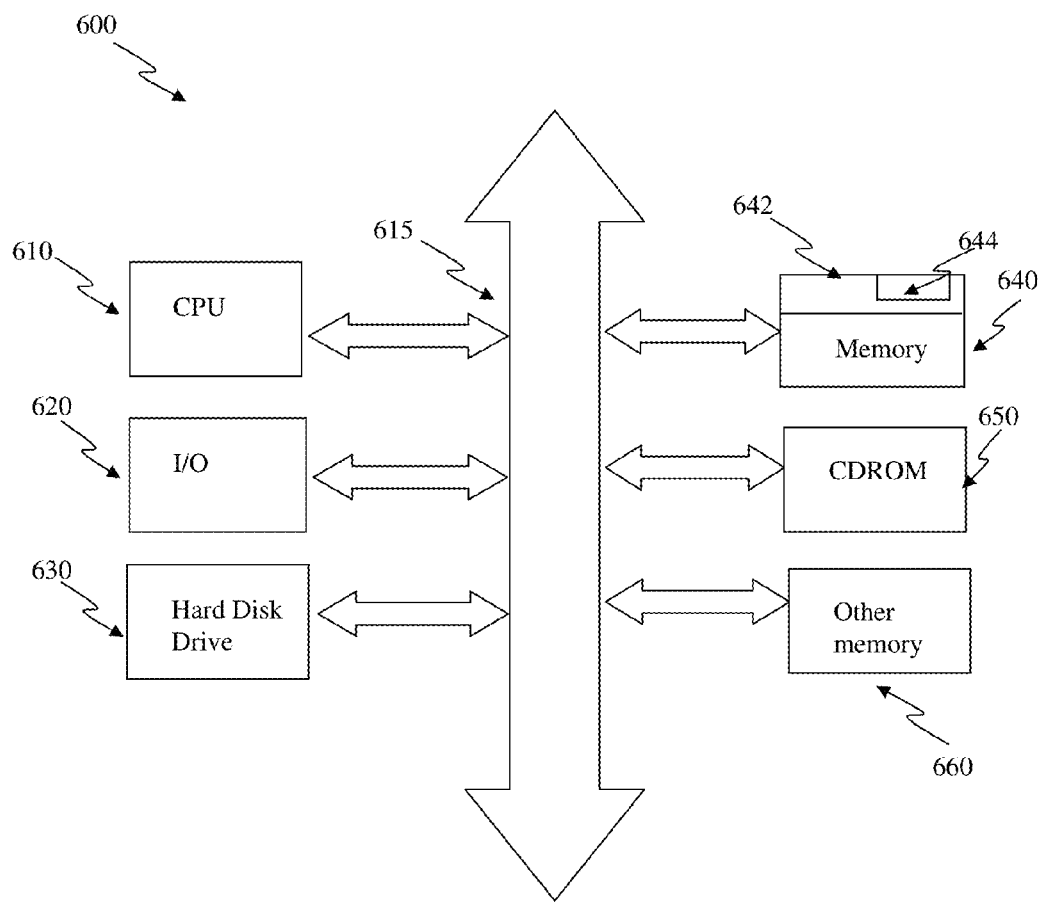
FIG. 11 shows a method to generate memories in a memory compiler.

FIG. 11 shows a processor system 600 according to one embodiment. The processor system 600 can include a programmable resistive device 644, such as in a cell array 642, in programmable resistive memory 640, according to one embodiment. The processor system 600 can, for example, pertain to a computer system. The computer system can include a Central Process Unit (CPU) 610, which communicate through a common bus 615 to various memory and peripheral devices such as I/O 620, hard disk drive 630, CDROM 650, programmable resistive memory 640, and other memory 660. Other memory 660 is a conventional memory such as SRAM, DRAM, or flash, typically interfaces to CPU 610 through a memory controller. CPU 610 generally is a microprocessor, a digital signal processor, or other programmable digital logic devices. Memory 640 is preferably constructed as an integrated circuit, which includes the memory array 642 having at least one programmable resistive device 644. The memory 640 typically interfaces to CPU 610 through a memory controller. If desired, the memory 640 may be combined with the processor, for example CPU 610, in a single integrated circuit.

There are many variations in the embodiments of this invention. For example, the memory can be ROM, SRAM, DRAM, flash, or OTP memory in particular. Moreover, the memory can be a datapath, such as adder, multiplier, or floating-point adder/multiplier, or a register file. The scripts can be any kinds of programming languages such as Skill, C, awk, Perl, Unix Shell, or Job Description Language (JCL), etc. The memory templates can be more than one to target different ranges of memory capacities. The memories compiled can be used as stand alone memories, or embedded memory to be integrated with an SoC, or used in an electronics system. The method to generate memories may include a Graphics User Interface (GUI) for users to input memory configurations and requirements so that the software can take these inputs to generate memories accordingly. Similarly, the output of the memory compiler may include a GUI to display the memories generated. For those skilled in the art understand that various embodiments are possible and they are still within the scope of this invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A non-transitory computer readable medium including at a memory compiler configured to generate memories, the computer readable medium comprising:
   at least one memory template with a maximum capacity having a layout database and auxiliary design databases;
   at least one software program operating on the layout database of the memory template to reduce the memory array sizes, to move, add, remove, stretch, connect, or disconnect layout objects;
   at least one software program operating on the auxiliary design databases of the memory template to generate the new auxiliary design databases corresponding to the new layout database; and
   at least one memory database based on the memory template being generated by running the software programs.

2. A non-transitory computer readable medium as recited in claim 1, wherein the memory array size ratio to that of the memory template is one over 2's powers (i.e. 1/2, 1/4, 1/8, etc.).

3. A non-transitory computer readable medium as recited in claim 1, wherein the high orders of the row and/or column addresses are disabled in the newly compiled memories from the memory template.

4. A non-transitory computer readable medium as recited in claim 1, wherein the layout objects around the memory array of the memory template can be stretched to fit the new floor plan of the compiled memories.

5. A non-transitory computer readable medium as recited in claim 1, wherein the auxiliary design database comprises at least one of the layout phantom, behavior model, synthesis view, placement and routing view, or datasheet of the memory.

6. A non-transitory computer readable medium as recited in claim 1, wherein the memory cell is an OTP cell with at least one of the cells comprising a junction diode, polysilicon diode, or isolated active-region diode as program selector.

7. A non-transitory computer readable medium as recited in claim 1, wherein the memory cell is an anti-fuse cell with at least one of the cells comprising a dielectric film and formed at the cross points of two perpendicular conductors.

8. An electronics system comprises:
a processor;
at least one memory generated from a memory compiler operatively connected to the processor, wherein the memory compiler comprising:
  at least one memory template with a maximum capacity to compile the memories from, the memory template having a layout database and auxiliary design databases;
  at least one software program operating on the layout database of the memory template to reduce the memory array sizes, to move, add, remove, stretch, connect, or disconnect layout objects;
  at least one software program operating on the auxiliary design databases of the memory template to generate new auxiliary design databases corresponding to the new layout database; and
  at least one memory database based on the memory template being generated by running the software programs.

9. A compiled memory as recited in claim 8, wherein the memory array size ratio to that of the memory template is one over 2's powers (i.e. 1/2, 1/4, 1/8, etc.).

10. A compiled memory as recited in claim 8, wherein the high orders of the row and/or column addresses are disabled in the new compiled memory from the memory template.

11. A compiled memory as recited in claim 8, wherein the layout objects around the memory array of the memory template can be stretched to fit the new floor plan of the compiled memory.

12. A memory compiler as recited in claim 8, wherein the auxiliary design database comprises at least one of the layout phantom, behavior model, synthesis view, placement and routing view, or memory datasheet.

13. A method for providing a memory compiler, comprising:
providing at least one template of memory with maximum capacity in layout database and auxiliary design database,
providing at least one software program operating on the layout database of the memory template to reduce the memory array sizes, to move, add, remove, stretch, connect, or disconnect layout objects;
providing at least one software program operating on the auxiliary design databases of the memory template to generate new auxiliary design corresponding to the layout database; and
generating at least one memory database based on the memory template by running the software programs.

14. A software program as recited in claim 13, wherein the software program is based on Skill, C, or Skill-like language.

15. A software program as recited in claim 13, wherein the software program is based on the Unix, awk, Perl, or Unix-like script.

16. A software program as recited in claim 13, wherein the method to generate the loading, slew rate, timing, and/or other parameters in the new auxiliary files is based on linear interpolation or extrapolation operating on a single or a plurality of variables.

17. A compiled memory as recited in claim 13, wherein the memory array size ratio to that of the memory template is one over 2's powers (1/2, 1/4, 1/8, etc.).

18. A compiled memory as recited in claim 13, wherein the layout objects around the memory array of the memory template can be stretched to fit the new floor plan of the compiled memory.

19. A memory compiler as recited in claim 13, wherein the auxiliary design database comprises at least one of the layout phantom, behavior model, synthesis view, placement and routing view, or memory datasheet.

20. A memory compiler as recited in claim 13, wherein at least one of the users' requirements for generating memories, the memory templates, or the memories generated from the memory compiler are input and/or output to/from a graphics user interface.

* * * * *